US008779725B2

(12) United States Patent
Knight

(10) Patent No.: US 8,779,725 B2
(45) Date of Patent: Jul. 15, 2014

(54) SYSTEM AND METHOD FOR IMPROVED BATTERY PROTECTION CUTOFF

(71) Applicant: Zero Motorcycles, Inc., Scotts Valley, CA (US)

(72) Inventor: Nathan Glenn Knight, Santa Cruz, CA (US)

(73) Assignee: Zero Motorcycles, Inc., Scotts Valley, CA (US)

( * ) Notice: Subject to any disclaimer, the term of this patent is extended or adjusted under 35 U.S.C. 154(b) by 149 days.

(21) Appl. No.: 13/671,295

(22) Filed: Nov. 7, 2012

(65) Prior Publication Data

US 2014/0125259 A1    May 8, 2014

(51) Int. Cl.
*H02J 7/00* (2006.01)
*G01R 31/36* (2006.01)
*H02P 31/00* (2006.01)

(52) U.S. Cl.
CPC ............ *G01R 31/3606* (2013.01); *H02P 31/00* (2013.01)
USPC ........... 320/134; 320/116; 320/124; 320/128; 320/132; 320/136; 320/150; 320/151; 320/157; 320/165; 318/400.21; 318/471; 318/472; 307/10.7

(58) Field of Classification Search
CPC ...... H02P 31/00; H01M 10/425; H01M 10/44
USPC ......... 320/116, 124, 128, 132, 134, 136, 150, 320/151, 157, 161, 165; 318/400.21, 318/400.22, 471, 472; 361/274.1, 272; 363/56.03, 56.04, 56.05, 56.1, 56.12; 307/10.7

See application file for complete search history.

(56) References Cited

U.S. PATENT DOCUMENTS

2011/0234166 A1*  9/2011  Liu .............................. 320/132

* cited by examiner

*Primary Examiner* — Antony M Paul
(74) *Attorney, Agent, or Firm* — Gard & Kaslow LLP

(57) ABSTRACT

Improved protection for a rechargeable battery from damage by being discharged below a cut-off voltage is provided. The measured voltage of a battery under load is lower than the measured voltage of the battery under no load. As the cut-off voltage for the battery is specified as a no load voltage, comparing the measured voltage of the battery under load to the cut-off voltage would result in stopping use of the battery with useable charge remaining. Through testing, a set of relationships for estimating the no load voltage of a battery under load has been determined. Using this set of relationships with battery measurements, an estimated no load voltage for the battery is determined. This estimated no load voltage is compared to the cut-off voltage. This allows for full use of the battery while stopping use of the battery when its voltage reaches the cut-off, thereby preventing damage.

18 Claims, 3 Drawing Sheets

Cell Internal Resistance Vs Charge State % and Temp
Values in microohms

| Cell Temp | Charge State % | | | | | | | | | | | | | | | | | | |
|---|---|---|---|---|---|---|---|---|---|---|---|---|---|---|---|---|---|---|---|
| | 5 | 10 | 15 | 20 | 25 | 30 | 35 | 40 | 45 | 50 | 55 | 60 | 65 | 70 | 75 | 80 | 85 | 90 | 95 |
| 0C | 43752 | 37762 | 32403 | 27638 | 23433 | 19753 | 16563 | 13828 | 11512 | 9582 | 8002 | 6736 | 5750 | 5010 | 4479 | 4123 | 3907 | 3797 | 3756 |
| 25C | 16043 | 15585 | 15169 | 14438 | 13075 | 11729 | 10418 | 9176 | 8072 | 7243 | 6436 | 5672 | 4993 | 4486 | 3996 | 3541 | 3157 | 2913 | 3025 |
| 50C | 1948 | 1865 | 1729 | 1638 | 1636 | 1626 | 1602 | 1593 | 1615 | 1604 | 1528 | 1476 | 1481 | 1476 | 1451 | 1494 | 1539 | 1587 | 1643 |

Fig. 3

SYSTEM AND METHOD FOR IMPROVED BATTERY PROTECTION CUTOFF

BACKGROUND

1. Field of the Invention

The present invention relates generally to rechargeable battery systems for electric vehicles, and more particularly, to protection for such a battery.

2. Description of the Prior Art

Electric vehicles commonly use a rechargeable battery to provide energy for operating the vehicle's motor. The battery is discharged as it is used. Discharging a rechargeable battery below a certain critical voltage, commonly known as a cut-off voltage, may result in permanent battery damage.

It is desirous to protect the battery from damage by sensing when the battery voltage is at the cut-off, and take steps such as disconnecting the battery from loads such as the electric motor in the vehicle, to prevent battery damage from occurring. It is equally desirous to allow the user or operator to use the battery fully. As should be apparent, these two objectives can be in conflict.

To protect the battery from damage, yet allow the battery to be used to its capacity, the battery must be monitored and action taken when the battery reaches its cut-off voltage.

A problem arises, however, in comparing the measured battery voltage to the cut-off voltage. The cut-off voltage specified by a battery manufacturer is a measurement made in a no load condition, when the battery is not operating devices such as motors, lights, or other electrical devices.

As explained further elsewhere herein, the measured voltage of a battery under load, when the battery is operating, for example, an electric vehicle with an electric motor, lights, and other equipment, is lower than the measured voltage of the battery when it is in a no load condition, as is the case when the battery is not supplying power to those devices.

Because the measured voltage of the battery under load is lower, stopping use of the battery when its measured voltage under load is below the cut-off voltage could stop use of the battery prematurely, when there is still useable energy left in the battery, for example, for operating the vehicle.

The measured voltage of a battery under load is lower than the measured voltage of the battery under no load because of the internal resistance of the battery.

This lowered voltage, or voltage drop, caused by the internal resistance of the battery is commonly referred to as sag. As the load on the battery increases, and current drawn from the battery increases, the sag caused by internal resistance increases, and the measured battery voltage decreases. This decrease makes comparison of the measured battery voltage to the cut-off voltage problematic. While such a comparison will protect the battery, it will also stop use of the battery prematurely, with useable charge remaining.

What is needed is a way to protect a battery from being discharged past its cut-off voltage while avoiding the problem of sag induced lower voltage measurements of a battery under load.

SUMMARY

In one embodiment is provided a system and method for improved battery protection cutoff. The system comprises a rechargeable battery, a current sensor coupled to the battery for sensing battery current flow, a battery monitor coupled to the battery for monitoring the voltage and the temperature of the battery, a memory containing a set of relationships among charge state, battery temperature, and internal resistance, and a battery controller coupled to the current sensor and the battery monitor. The battery monitor updates an estimated charge state based on the measured battery current flow through the current sensor. The battery controller measures a battery voltage and a battery temperature using the battery monitor and battery sensors coupled to the battery. The battery controller determines an estimated internal resistance for the battery from the set of predetermined relationships using the estimated charge state and the measured battery temperature. The battery controller then determines a sag voltage from the estimated internal resistance and measured battery current flow, and determines a no load voltage estimate for the battery by adding the sag voltage to the measured battery voltage. The battery controller determines that the no load voltage estimate is equal or less than a cut-off voltage, and signals that a cut-off threshold has been reached, stopping use of the battery and protecting the battery from damage.

BRIEF DESCRIPTION OF DRAWINGS

FIG. 3 is a table showing a representation of charge state, cell temperature, and cell internal resistance according to an embodiment.

DETAILED DESCRIPTION

Figure 1:
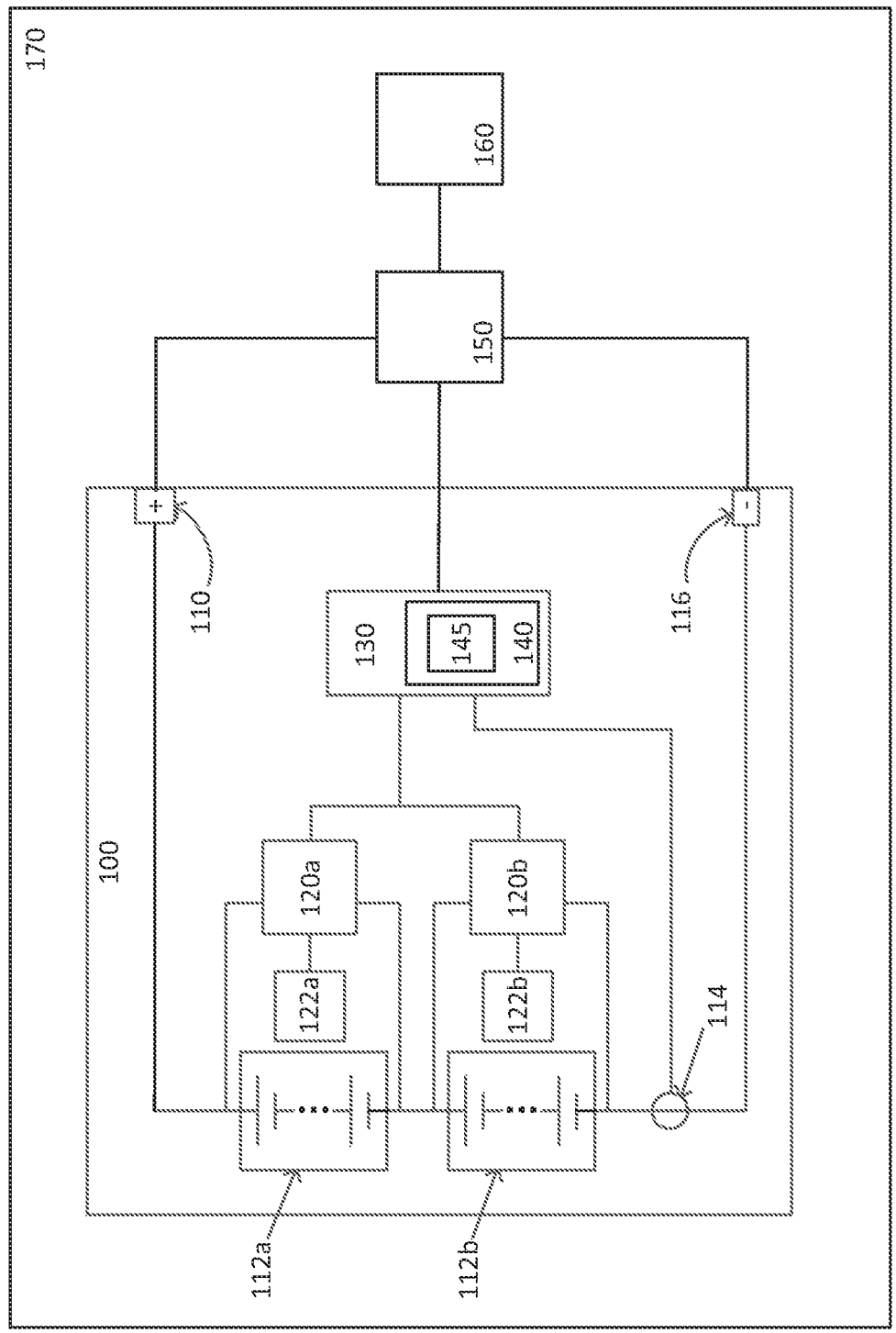
FIG. 1 is a schematic of a battery subsystem in an electric vehicle according to one embodiment.

Described herein are various embodiments of improved battery cutoff protection. A rechargeable battery is protected from damage caused by being discharged below a defined cut-off voltage.

As is known in the art, the measured voltage of a battery under load is lower than the measured voltage of the battery under no load. As the cut-off voltage for the battery is specified as a no load voltage, comparing the measured voltage of the battery under load to the cut-off voltage would result in stopping use of the battery with useable charge remaining.

As is also known in the art, discharging a rechargeable battery below a cut-off voltage may result in permanent damage to the battery. This cut-off voltage is typically specified by the battery manufacturer, and is specified with the battery in a no load state.

Comparing this cut-off voltage to the measured voltage of the battery under load cannot be done directly, as the measured voltage of the battery under load is lower than the measured voltage of the battery under no load.

This difference between the measured voltage of the battery under load and the measured voltage of the battery under no load is caused by the internal resistance of the battery. This voltage drop, called sag, increases with increasing load on the battery. As the load on the battery increases, the current flowing into the load increases, and the sag caused by internal resistance increases, resulting in a lower measured battery voltage.

Making a comparison between the cut-off voltage and the measured voltage of the battery under load would prematurely stop use of the battery, not allowing use of the battery's full capacity.

According to the approach described herein, the cut-off voltage is compared to an estimate of the no load battery voltage determined from the battery under load. This estimate is made by estimating the internal resistance of the battery, which is then used to determine an estimated no load voltage for the battery.

Through testing, a set of relationships among battery charge state, battery temperature, and estimated internal resistance have been developed. As an example, one or more batteries are tested over a range of temperatures and charge states, measuring their internal resistance to develop the set of relationships.

In use, this set of relationships is used with the estimated charge state of the battery and measurements of battery temperature to estimate internal resistance. This estimated internal resistance is then used to calculate a sag voltage and determine an estimate of no load voltage for the battery.

During battery use, a battery controller uses Coulomb counting to maintain an estimated charge state for the battery. The battery monitor takes the estimated charge state and measurements of battery voltage, battery current, and battery temperature during use. Using the estimated charge state and measured battery temperature with the set of relationships developed during testing, the battery controller determines an estimated internal resistance for the battery.

Using the estimated internal resistance and the measured current, the battery monitor calculates a sag voltage. The battery monitor adds the sag voltage to the measured battery voltage to estimate a no load battery voltage. This estimated no load battery voltage is used by the battery monitor to compare to the cut-off voltage to determine when to stop use of the battery to prevent damage.

Referring now to FIG. 1, an embodiment of battery subsystem 100 in electric vehicle 170 is shown. Battery subsystem 100 comprises two or more series connected rechargeable storage cells 112a, 112b, current sensor 114, positive terminal 110, negative terminal 116, battery monitors 120a, 120b with battery sensors 122a, 122b, and battery controller 130 with memory 140. Positive terminal 110 and negative terminal 116 connect to devices such as motor controller 150, and external chargers, not shown.

Positive terminal 110 is coupled to a positive lead of the series connected rechargeable storage cells 112a. Similarly negative terminal 116 is coupled to a negative lead of the series connected rechargeable storage cells 112b.

Battery controller 130 monitors the status of rechargeable storage cells 112a and 112b using battery sensors 122a and 122b connected to battery monitors 120a and 120b, for example measuring cell voltages. Battery monitor 130 is coupled to current sensor 114 for sensing battery current flow.

Battery controller 130 is coupled to motor controller 150 which controls electric motor 160.

In one embodiment and as shown in FIG. 1, each of storage cells 112a, 112b comprise a plurality of individual rechargeable storage cells. Storage cells 112a comprise a plurality of series connected rechargeable storage cells. Similarly, storage cells 112b comprise a plurality of series connected rechargeable storage cells. In one embodiment, the rechargeable storage cells are Lithium-ion cells, such as Lithium Nickel Manganese Cobalt oxide (NMC) pouch cells. Other embodiments may use different Lithium-ion chemistries.

In one embodiment, battery controller 130 is a Texas Instruments® Stellaris ARM Cortex-M3 System on a Chip (SOC), providing a CPU, volatile and nonvolatile memory, and advanced I/O. Memory 140 may be internal to memory controller 130, such as a portion of the nonvolatile memory, or may be an external nonvolatile memory such as a Flash memory device or an Electrically Erasable Programmable Read Only Memory (EEPROM) coupled to battery controller 130.

Current sensor 114 provides information to battery controller 130 on the current flowing into or out of rechargeable energy cells 112a, 112b. As an example, current flows out of cells 112a, 112b when driving a motor or other load (not shown). Current flows into cells 112a, 112b during charging or regenerative braking.

In one embodiment, current sensor 114 is a resistive current shunt. By placing a known resistance between cells 112b and negative terminal 116, current flowing through the shunt produces a voltage drop across the shunt which is proportional to the current flowing through the shunt, according to Ohm's Law.

In another embodiment, current sensor 114 is a Hall-effect sensor, producing an output coupled to battery controller 130 which is a function of sensing the magnetic field generated by current flow through the conductor connecting cells 112b and negative terminal 116.

Current sensor 114 may be located anywhere along the current path between positive terminal 110 and negative terminal 116, as the current flow through each element of a series connection is the same. Measured current flow will be the same if current sensor 114 is located between positive terminal 110 and storage cells 112a, between storage cells 112a and 112b, or as shown in FIG. 1 between storage cells 112b and negative terminal 116.

In one embodiment, storage cells in 112a and 112b comprise individual storage cells connected in series, each supported by a battery monitor. As an example, each storage cell 112a is coupled to battery monitor 120a and battery sensor 122a such as the Texas Instruments® PL536 battery monitor integrated circuit and supporting circuitry. Such an embodiment organizes individual storage cells in series strings of up to six storage cells each, and can provide battery controller 130 with individual storage cell voltages, temperature of the group of storage cells, and can support storage cell balancing during charging.

In one embodiment of battery subsystem 100, storage cells 112a and 112b are implemented as 28 rechargeable storage cells in five series connected groups of cells; four groups of six series connected cells, and one group of four series connected cells. Each of these five groups of cells has a battery monitor 120 and battery sensor 122. In one embodiment, each cell is a Lithium Nickel Manganese Cobalt (NMC) pouch cell. This produces a battery pack with a nominal voltage of 102.2 Volts and a fully charged voltage of 116.2 Volts. Each NMC pouch cell has a capacity of between 23 and 25 Amp-hours, for a battery pack energy of between 2400 and 2800 Watt-hours. Peak current levels may exceed 200 Amps.

It is understood that in alternate embodiments of storage cells 112a and 112b, smaller capacity cells, such as 2 to 3 Amp-hour cells may be placed in parallel, and these cell groups then placed in series.

Battery controller 130 is loaded with purpose-built firmware to communicate with current sensor 114, and battery monitors 120a, 120b and perform the steps described elsewhere herein.

In operation according to one embodiment, battery controller 130 tracks the estimated charge state of storage cells 112a and 112b using a technique known as Coulomb counting (also known as charge counting), maintaining the estimated charge state of the battery.

A Coulomb in the International System of Units (SI) is a derived unit of electrical charge, defined as the charge transported by a current of one Ampere for one second.

Battery controller 130 reads current sensor 114 to measure current flowing into and out of storage cells 112a, 112b over time to track the estimated charge state of the battery. Current flowing out of the battery for example to motor controller 150 and motor 160 decreases the estimated charge state, while operations such as charging or regenerative braking put energy back into the battery, increasing the estimated charge state.

Through testing, a set of relationships 145 among battery charge state, battery temperature, and estimated internal resistance have been developed. As an example, the internal resistance of the battery is measured over a range of charge states and battery temperatures, thereby determining a set of relationships among battery charge state, battery temperature, and internal resistance.

It is to be understood that these relationships are dependent on the type of cells used to make up the battery; changes in cell construction such as cell chemistry, cell materials, and the like may change these relationships. Data collected for one representative battery may be used to represent multiple batteries of that type. Data may be collected from multiple batteries of one type and a set of averages developed.

Data may also be collected in a similar manner from a representative cell or cells used in storage cells 112a, 112b comprising the battery, as an example by measuring the internal resistance of the cell over a range of charge states and cell temperatures, thereby determining a set of relationships among cell charge state, cell temperature, and internal resistance.

This set of relationships 145 among battery charge state, battery temperature, and estimated internal resistance is stored in nonvolatile form as a data structure in memory 140, for use by battery controller 130. The data structure of this set 145 may be in the form of a table, a list, or other data structure suitable for use with battery controller 130.

FIG. 3 shows a representative table according to an embodiment, showing in a simplified form the set of relationships 145 among cell temperature, charge state, and internal resistance of the cell. As shown, charge state values range from 5 to 95 percent, temperatures from 0 to 50 degrees Celsius, with internal resistance values given in microOhms.

Returning to FIG. 1, periodically, battery controller 130 estimates the no load voltage of the battery. Battery controller 130 measures battery temperature and battery voltage using battery monitors 120 and battery sensors 112. Battery current is measured as part of the Coulomb counting process which determines the estimated charge state of the battery. Using the set of relationships 145, battery monitor 130 determines an estimated internal resistance for the battery using the estimated charge state and the measured battery temperature. Using the estimated internal resistance and the measured battery current, battery controller 130 determines a sag voltage by multiplying the estimated internal resistance by the measured battery current. Battery controller 130 adds the sag voltage to the measured battery voltage to produce an estimated no load battery voltage. This estimated no load battery voltage is compared by battery controller 130 against a cut-off voltage to determine when to stop battery use.

Figure 2:
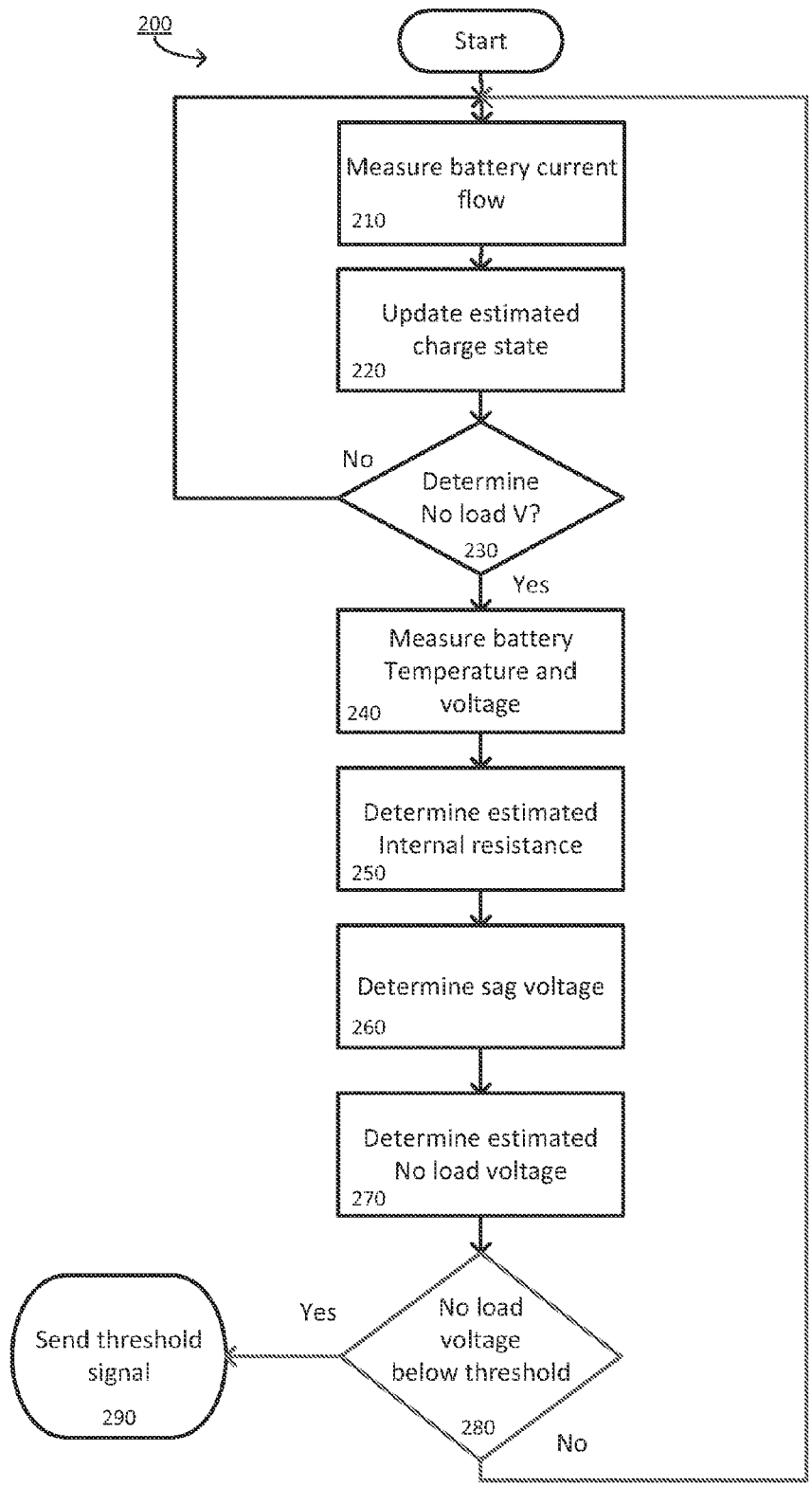
FIG. 2 is a flowchart of a process for improved battery protection according to one embodiment.

Referring now to FIG. 2, a flowchart of a process for improved battery protection 200 according to an embodiment is shown.

In step 210, battery current flow is measured. In one embodiment, battery controller 130 samples current flow on cells 112a, 112b as measured by current sensor 114.

In step 220, the estimated charge state is updated. Battery controller 130 updates the estimated charge state using current flow measured by current sensor 114. The estimated charge state is decreased if current sensor 114 measured current flowing out of cells 112a, 112b, and increased if current sensor 114 measured current flowing into cells 112a, 112b.

In step 230, a test is made to determine if an estimated no load voltage should be calculated. The estimated no load battery voltage is updated periodically. In one embodiment, battery controller 130 determines if an estimated no load voltage should be calculated. This may be done, for example, by updating the estimated no load voltage at a predetermined interval such as once per second.

If the estimated no load voltage is not to be updated, Coulomb counting resumes with step 210.

If the estimated no load voltage is to be calculated, processing continues with step 240.

In step 240, battery temperature and voltage are measured. In one embodiment, battery monitor 130 measures battery temperature and battery voltage through battery monitors 120 and battery sensors 112.

In step 250, an estimated internal resistance of the battery is determined. In one embodiment, battery monitor 130 uses the set 145 of relationships using the measured battery temperature and estimated charge state from step 220 to determine an estimated internal resistance.

In step 260, a sag voltage is determined from the estimated internal resistance and measured current flow. In one embodiment, battery monitor 130 multiplies the estimated internal resistance by the measured current flow from step 210 to determine a sag voltage according to Ohm's law.

In step 270, an estimated no load voltage is determined. In one embodiment, battery monitor 130 adds the sag voltage determined in step 260 to the measured battery voltage from step 240 to determine an estimated no load voltage.

In step 280, the estimated no load voltage is compared against the cut-off voltage. In one embodiment, battery monitor 130 compares the estimated no load voltage against the cut-off voltage, stopping use of the battery when this threshold is reached, thereby protecting the battery from damage while allowing for full use of the battery.

If the estimated no load battery voltage is above the cut-off voltage, the process of Coulomb counting resumes with step 210.

In step 290, if the no load battery voltage is at or below the cut-off voltage, battery use is stopped. In one embodiment, battery monitor 130 signals to external devices such as motor controller 150 to stop delivering power to motor 160. In another embodiment, a relay or contactor within battery subsystem 100 (not shown) is opened to disconnect the battery from any load, protecting the battery from damage.

In an additional embodiment, test step 230 is not performed. The estimated charge state is updated in step 220, following which battery temperature and voltage are measured in step 240. Processing then continues with steps 250 through 280, continuing with step 210 if the estimated no load battery voltage is above the cut-off voltage.

As an example of process 200, consider the operation of electric vehicle 170. Under acceleration, the current demand placed on a battery by motor controller 150 and associated motor 160 may be on the order of 200 Amps. Such current levels will result in appreciable sag even with batteries having internal resistances in the milli-Ohm range.

According to previous approaches where the battery voltage under load is compared to the cut-off voltage, such acceleration events will develop sufficient sag to reach the cut-off voltage, stopping use of the motor, despite the fact that there may be sufficient useable battery capacity remaining.

Under the embodiments herein described, an estimated no load voltage is calculated for the battery under load by using a set of relationships among battery temperature, charge state, and internal resistance to estimate battery internal resistance from measured battery temperature and estimated charge state. This internal resistance is multiplied by the measured current to determine the sag voltage. The sag voltage is added to the measured battery voltage to produce an estimated no load voltage which is then compared to the cut-off voltage, permitting continued operation of the vehicle until the cut-off voltage is reached, at which point battery use is stopped, thus preventing damage, yet having provided use of remaining useful battery capacity.

In other embodiments, multiple thresholds may be used rather than a single cut-off voltage. As an example, a threshold voltage higher than the cut-off voltage such as a limp threshold voltage is defined which when reached signals motor controller 150 to place vehicle 170 in a mode limiting power consumption by restricting performance, for example by limiting vehicle acceleration and/or top speed, allowing restricted operation of the vehicle while extending the remaining battery life. Such a restricted performance mode is referred to herein as a limp mode.

It is to be understood that the examples given are for illustrative purposes only and may be extended to other implementations and embodiments with different conventions and techniques. While a number of embodiments are described, there is no intent to limit the disclosure to the embodiment(s) disclosed herein. On the contrary, the intent is to cover all alternatives, modifications, and equivalents apparent to those familiar with the art.

In the foregoing specification, the invention is described with reference to specific embodiments thereof, but those skilled in the art will recognize that the invention is not limited thereto. Various features and aspects of the herein-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A method for improved battery protection cutoff for a rechargeable battery, the method comprising:
    measuring battery current flow by a battery controller coupled to a current sensor,
    updating, by the battery controller, an estimated charge state based on the measured battery current flow,
    measuring, by the battery controller coupled to a battery monitor coupled to the battery, a battery voltage and a battery temperature,
    determining, by the battery controller, an estimated internal resistance for the battery from a set of predetermined relationships among charge state, battery temperature, and internal resistance, using the estimated charge state and the measured battery temperature,
    determining, by the battery controller, a sag voltage from the estimated internal resistance and measured battery current flow,
    determining, by the battery controller, a no load voltage estimate for the battery by adding the sag voltage to the measured battery voltage,
    determining, by the battery controller, that the no load voltage estimate is equal to or less than a threshold voltage,
    and
    signaling by the battery controller, that the threshold voltage has been reached.

2. The method of claim 1 where the threshold voltage is a cut-off voltage.

3. The method of claim 2 where the step of signaling by the battery controller that a cut-off voltage has been reached comprises signaling a motor controller to cut power to a motor.

4. The method of claim 1 where the threshold voltage is a limp threshold voltage.

5. The method of claim 4 where the step of signaling by the battery controller that a limp threshold voltage has been reached signals a motor controller to place a motor in a restricted performance mode.

6. The method of claim 1 where the set of predetermined relationships among charge state, battery temperature, and internal resistance is determined by testing a representative battery.

7. The method of claim 1 where the set of predetermined relationships among charge state, battery temperature, and internal resistance is determined by testing a representative storage cell.

8. The method of claim 1 where the set of predetermined relationships among charge state, battery temperature, and internal resistance is stored in a nonvolatile memory in the battery monitor.

9. The method of claim 1 where the set of predetermined relationships among charge state, battery temperature, and internal resistance is stored in a nonvolatile memory coupled to the battery monitor.

10. A system for improved battery cutoff protection comprising:
    a rechargeable battery,
    a current sensor coupled to the battery for sensing battery current flow,
    a battery monitor coupled to the battery for monitoring the voltage and the temperature of the battery,
    a memory containing a set of relationships among charge state, battery temperature, and internal resistance,
    and
    a battery controller coupled to the current sensor and the battery monitor, wherein the battery controller is configured to:
        update the estimated charge state using sensed battery current flow,
        sense a battery voltage and a battery temperature,
        determine, from the set of relationships among charge state, battery temperature, and internal resistance, an estimated internal resistance using the estimated charge state and sensed battery temperature,
        determine a sag voltage from the estimated internal resistance and the sensed battery current flow,
        determine an estimated no load voltage by adding the sensed battery voltage to the sag voltage,
        determine that the no load voltage estimate is equal or less than a threshold voltage,
        and
        signal that the threshold voltage has been reached.

11. The system of claim 10 where the memory containing a set of relationships among charge state, battery temperature, and internal resistance is part of the battery controller.

12. The system of claim 10 where the memory containing a set of relationships among charge state, battery temperature, and internal resistance is coupled to the battery controller.

13. The system of claim 10 wherein the threshold voltage is a cut-off voltage.

14. The system of claim 13 further comprising a motor controller and wherein the battery controller configured to signal that the threshold voltage has been reached is further configured to signal to the motor controller that the cut-off voltage has been reached.

15. The system of claim 14 further comprising a motor and wherein the motor controller is configured to cut power to the motor in response to receiving the signal that the cut-off voltage has been reached.

16. The system of claim 10 wherein the threshold voltage is a limp threshold voltage.

17. The system of claim 16 further comprising a motor controller and wherein the battery controller configured to signal that the limp threshold voltage has been reached is further configured to signal to the motor controller that the limp threshold voltage has been reached.

18. The system of claim 17 further comprising a motor and wherein the motor controller is configured to place the motor in a restricted performance mode in response to receiving the signal that the limp threshold voltage has been reached.

\* \* \* \* \*